United States Patent
Hang et al.

(10) Patent No.: US 9,087,937 B2
(45) Date of Patent: *Jul. 21, 2015

(54) GLASS COMPOSITION AND ITS USE IN CONDUCTIVE SILVER PASTE

(71) Applicant: E I DU PONT DE NEMOURS AND COMPANY, Wilmington, DE (US)

(72) Inventors: Kenneth Warren Hang, Cary, NC (US); Yueli Wang, Cary, NC (US)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 290 days.

This patent is subject to a terminal disclaimer.

(21) Appl. No.: 13/685,893

(22) Filed: Nov. 27, 2012

(65) Prior Publication Data

US 2013/0298982 A1 Nov. 14, 2013

Related U.S. Application Data

(60) Provisional application No. 61/645,263, filed on May 10, 2012.

(51) Int. Cl.
| | |
|---|---|
| H01L 31/0224 | (2006.01) |
| H01B 1/22 | (2006.01) |
| C03C 3/12 | (2006.01) |
| C03C 3/21 | (2006.01) |
| C03C 8/12 | (2006.01) |
| C03C 8/18 | (2006.01) |
| C03C 8/20 | (2006.01) |
| C03C 8/24 | (2006.01) |

(52) U.S. Cl.
CPC ........ *H01L 31/022425* (2013.01); *C03C 3/122* (2013.01); *C03C 3/21* (2013.01); *C03C 8/12* (2013.01); *C03C 8/18* (2013.01); *C03C 8/20* (2013.01); *C03C 8/24* (2013.01); *H01B 1/22* (2013.01); *H01L 31/02245* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 5,188,990 | A * | 2/1993 | Dumesnil et al. | 501/19 |
| 2008/0206553 | A1* | 8/2008 | Schneider et al. | 428/328 |
| 2009/0107546 | A1* | 4/2009 | Allison et al. | 136/256 |
| 2011/0192456 | A1 | 8/2011 | Hang | |
| 2011/0232746 | A1 | 9/2011 | Carroll et al. | |
| 2011/0277831 | A1* | 11/2011 | Yoshida et al. | 136/256 |
| 2012/0119153 | A1* | 5/2012 | Choi | 252/500 |

FOREIGN PATENT DOCUMENTS

| | | | |
|---|---|---|---|
| JP | 62128946 A | * | 6/1987 |
| TW | 201 144 250 A | | 12/2011 |
| WO | WO9200925 A1 | * | 1/1992 |

OTHER PUBLICATIONS

Phoenix Translations, English translation of JP62-128946A.*
U.S. Appl. No. 13/100,540, filed May 4, 2011, Carroll et al.
U.S. Appl. No. 13/100,550, filed May 4, 2011, Carroll et al.
U.S. Appl. No. 13/100,563, filed May 4, 2011, Carroll et al.
U.S. Appl. No. 13/100,533, filed May 4, 2011, Carroll et al.
U.S. Appl. No. 13/100,619, filed May 4, 2011, Mikeska at al.
EL1116 PCT Search Report.

* cited by examiner

*Primary Examiner* — Jeffrey T Barton
*Assistant Examiner* — Eric R Smith

(57) ABSTRACT

A lead-tellurium-lithium-titanium-oxide glass composition is useful as a component of a conductive silver paste. Especially useful are P-containing and V-containing lead-tellurium-lithium-titanium-oxide glass composition. Conductive silver via paste comprising particulate conductive silver and any of the lead-tellurium-lithium-titanium-oxide glass compositions of the invention can be used in providing the metallization of the holes in the silicon wafers of MWT solar cells. The result is a metallic electrically conductive via between the collector lines on the front side and the emitter electrode on the back-side of the solar cell. The paste can also be used to form the collector lines on the front-side of the solar cell and the emitter electrode on the back-side of the solar cell.

15 Claims, No Drawings

GLASS COMPOSITION AND ITS USE IN CONDUCTIVE SILVER PASTE

FIELD OF THE INVENTION

This invention is directed to a glass composition and its use in conductive silver paste. Such paste is useful in making solar cells, and in a metal-wrap-through (MWT) silicon solar cell.

TECHNICAL BACKGROUND OF THE INVENTION

A conventional solar cell with a p-type (p-doped) silicon base has an n-type (n-doped) emitter in the form of an n-type diffusion layer on its front-side. This conventional silicon solar cell structure uses a negative electrode to contact the front-side, i.e. the sun side, of the cell and a positive electrode on the back-side. It is well known that radiation of an appropriate wavelength falling on a p-n junction of a semiconductor serves as a source of external energy to generate electron-hole pairs. The potential difference that exists at a p-n junction causes holes and electrons to move across the junction in opposite directions, thereby giving rise to flow of an electric current that is capable of delivering power to an external circuit. Most solar cells are in the form of a silicon wafer that has been metallized, i.e., provided with metal electrodes which are electrically conductive. Typically, the front-side metallization is in the form of a so-called H pattern, i.e. in the form of a grid cathode comprising thin parallel finger lines (collector lines) and busbars intersecting the finger lines at right angles, whereas the back-side metallization is an aluminum anode in electric connection with silver or silver/aluminum busbars or tabs. The photoelectric current is collected by means of these two electrodes.

Alternatively, a reverse solar cell structure with an n-type silicon base is also known. This cell has a front p-type silicon surface (front p-type emitter) with a positive electrode on the front-side and a negative electrode to contact the back-side of the cell. Solar cells with n-type silicon bases (n-type silicon solar cells) can in theory produce higher efficiency gains compared to solar cells with p-type silicon bases owing to the reduced recombination velocity of electrons in the n-doped silicon.

As in the case of the conventional silicon solar cells, MWT silicon solar cells can be produced as MWT silicon solar cells having a p-type silicon base or, in the alternative, as MWT silicon solar cells having an n-type silicon base. As in conventional solar cells, the emitter of a MWT solar cell is typically covered with a dielectric passivation layer which serves as an antireflective coating (ARC) layer. However, MWT silicon solar cells have a cell design different than that of the conventional solar cells. The front-side electrodes of conventional solar cells reduce the effective photosensitive area available on the front-side of the solar cell and thereby reduce performance of the solar cell. MWT solar cells have both electrodes on the back-side of the solar cell. This is accomplished by drilling, e.g., with a laser, small holes that form vias between the front-side and the back-side of the cell.

The front-side of the MWT silicon solar cell is provided with a front-side metallization in the form of thin conductive metal collector lines which are arranged in a pattern typical for MWT silicon solar cells, e.g., in a grid- or web-like pattern or as thin parallel finger lines. The collector lines are applied from a conductive metal paste having fire-through capability. After drying, the collector lines are fired through the front-side dielectric passivation layer thus making contact with the front surface of the silicon substrate. The term "metal paste having fire-through capability" means a metal paste which etches and penetrates through (fires through) a passivation or ARC layer during firing thus making electrical contact with the surface of the silicon substrate.

The inside of the holes and, if present, the narrow rim around the front-edges of the holes, i.e., the diffusion layer not covered with the dielectric passivation layer, is provided with a metallization either in the form of a conductive metal layer on the sides of the hole or in the form of a conductive metal plug that completely fills the hole with conductive metal. The terminals of the collector lines overlap with the metallizations of the holes and are thus electrically connected therewith. The collector lines are applied from a conductive metal paste having fire-through capability. The metallizations of the holes are typically applied from a conductive metal paste and then fired. The metallizations of the holes serve as emitter contacts and form back-side electrodes connected to the emitter or electrically contact other metal deposits which serve as the back-side electrodes connected to the emitter.

The back-side of a MWT silicon solar cell also has the electrodes directly connected to the silicon base. These electrodes are electrically insulated from the metallizations of the holes and the emitter electrodes. The photoelectric current of the MWT silicon solar cell flows through these two different back-side electrodes, i.e., those connected to the emitter and those connected to the base.

Firing is typically carried out in a belt furnace for a period of several minutes to tens of minutes with the wafer reaching a peak temperature in the range of 550° C. to 900° C.

The efficiency of the MWT solar cells is improved since the emitter electrode is located on the back-side and thereby reduces shadowing of the photosensitive area available on the front-side of the solar cell. In addition the emitter electrodes can be larger in size and thereby reduce ohmic losses and all electrical connections are made on the back-side.

When producing a MWT solar cell there is a need for a conductive paste that results in a metalized hole that: (1) has sufficiently low series resistance between the collector lines and the emitter electrode, (2) has good adhesion to the sides of the hole and to the silicon on the backside of the solar cell and (3) has sufficiently high shunting resistance to prevent deleterious electrical connection between portions of the cell, i.e., the emitter and the base.

SUMMARY OF THE INVENTION

The present invention relates to a lead-tellurium-lithium-titanium-oxide glass composition comprising at least 15 wt % but less than 25 wt % PbO, 40-75 wt % $TeO_2$, 0.1-4 wt % $Li_2O$ and 0.25-5 wt % $TiO_2$ based on the total weight of said lead-tellurium-lithium-titanium-oxide.

In one embodiment the lead-tellurium-lithium-titanium-oxide glass composition further comprises $P_2O_5$. In another embodiment the lead-tellurium-lithium-titanium-oxide glass composition further comprises $V_2O_5$.

The present invention also relates to conductive silver paste comprising:
  (a) silver;
  (b) a lead-tellurium-lithium-titanium-oxide glass composition comprising at least 10 wt % but less than 25 wt % PbO, 40-75 wt % $TeO_2$, 0.1-4 wt % $Li_2O$ and 0.25-5 wt % $TiO_2$, based on the total weight of said lead-tellurium-lithium-titanium-oxide; and
  (c) an organic vehicle, wherein the silver and the lead-tellurium-lithium-titanium-oxide are dispersed in said organic vehicle.

This conductive silver paste is useful in providing conductive elements on solar cells and is particularly useful in providing the metallization of the holes in the silicon wafers of MWT solar cells. This metallization results in a metallic electrically conductive via between the collector lines on the front side and the emitter electrode on the back-side of the solar cell.

Also provided is a metal-wrap-through silicon solar cell comprising the fired conductive silver paste of the invention.

DETAILED DESCRIPTION OF THE INVENTION

It is believed that the conductive silver via paste of the present invention will allow for the production of MWT silicon solar cells with improved performance. It is believed that the conductive silver paste will have good hole filling capability and that the fired conductive silver paste will adhere well to the inside of the holes of the silicon wafer and to the silicon on the backside of the solar cell and provide sufficiently high shunting resistance and sufficiently low series resistance. The result is a metallic electrically conductive via between the collector lines on the front side and the emitter electrode on the back-side of the solar cell. The paste can also be used to form the collector lines on the front-side of the solar cell and the emitter electrode on the back-side of the solar cell.

The conductive silver paste comprises silver, a lead-tellurium-lithium-titanium-oxide glass composition and an organic vehicle. Each constituent of the conductive silver paste of the present invention is discussed in detail below.

Silver

In the present invention, the conductive phase of the paste is silver (Ag). The silver can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), or mixtures thereof. Other forms of silver compatible with the other thick-film paste components can also be used.

In one embodiment the silver is in the form of spherical silver particles. The powder of spherical silver particles has a relatively narrow particle size distribution. In an embodiment the spherical silver particles have a $d_{50}$ of from 1.7 to 1.9 μm, wherein the median particle diameter, $d_{50}$, is determined by means of laser diffraction. In one such embodiment, the spherical silver particles have a $d_{10} \geq 1$ μm and a $d_{90} \leq 3.8$ μm. In another embodiment, the silver is in the form of irregular (nodular) silver particles having a $d_{50}$ of from 5.4 to 11.0 μm. The $d_{10}$, $d_{50}$ and $d_{90}$ represent the 10th percentile, the median or 50th percentile and the 90th percentile of the particle size distribution, respectively, as measured by volume. That is, the $d_{50}$ ($d_{10}$, $d_{90}$) is a value on the distribution such that 50% (10%, 90%) of the particles have a volume of this value or less.

The silver may be uncoated or the surface at least partially coated with a surfactant. The surfactant may be selected from, but is not limited to, stearic acid, palmitic acid, lauric acid, oleic acid, capric acid, myristic acid and linolic acid and salts thereof, e.g., ammonium, sodium or potassium salts. In one embodiment the surfactant is diethylene glycol and the particle surfaces are essentially completely coated.

In another embodiment, the silver is in the form of silver flake. In one embodiment, an average particle size of the silver flake is less than 10 microns. In another embodiment, the average particle size is less than 5 microns.

The silver is present in the conductive silver paste in a proportion of 80 to 90 wt %, based on the total weight of the conductive silver paste. In one embodiment, the silver is present in the conductive silver paste in a proportion of 85 to 90 wt %, based on the total weight of the conductive silver paste.

Pb—Te—Li—Ti—O Glass Composition

The conductive silver paste also comprises lead-tellurium-lithium-titanium-oxide (Pb—Te—Li—Ti—O). In one embodiment, the lead-tellurium-lithium-titanium-oxide is a glass. In a further embodiment, the lead-tellurium-lithium-titanium-oxide is crystalline, partially crystalline, amorphous, partially amorphous, or combinations thereof. In an embodiment, the Pb—Te—Li—Ti—O includes more than one glass composition. In another embodiment, the Pb—Te—Li—Ti—O includes a glass composition and an additional composition, such as a crystalline composition. The terms "glass" or "glass composition" will be used herein to represent any of the above combinations of amorphous and crystalline materials.

In an embodiment, glass compositions described herein include lead-tellurium-lithium-titanium-oxide. The glass compositions may also include additional components as disclosed below.

The lead-tellurium-lithium-titanium-oxide (Pb—Te—Li—Ti—O) may be prepared by mixing PbO, $TeO_2$, $Li_2O$, and $TiO_2$ (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium, lithium, and titanium oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, quenching by splat cooling on a metal platen, or others appropriate for making powder forms of glass.

In one embodiment, the starting mixture used to make the Pb—Te—Li—Ti—O is comprised of (based on the total weight of the Pb—Te—Li—Ti—O) at least 15 wt % but less than 25 wt % PbO, 40-75 wt % $TeO_2$, 0.1 to 4 wt % $Li_2O$ and 0.25 to 5 wt % $TiO_2$. In another embodiment, the Pb—Te—Li—Ti—O is comprised of (based on the total weight of the Pb—Te—Li—Ti—O) at least 20 wt % but less than 25 wt % PbO, 45-75 wt % $TeO_2$, 0.5 to 2.5 wt % $Li_2O$ and 0.5 to 3 wt % $TiO_2$.

In one embodiment containing $P_2O_5$, the starting mixture used to make the Pb—Te—Li—Ti—O is comprised of (based on the total weight of the Pb—Te—Li—Ti—O) at least 15 wt % but less than 25 wt % PbO, 50 to 75 wt % $TeO_2$, 0.1 to 4 wt % $Li_2O$, 0.25 to 5 wt % $TiO_2$ and 3 to 12 wt % $P_2O_5$. In another such embodiment, the Pb—Te—Li—Ti—O is comprised of at least 20 wt % but less than 25 wt % wt % PbO, 55 to 75 wt % $TeO_2$, 0.5 to 2.5 wt % $Li_2O$, 0.5 to 3 wt % $TiO_2$ and 3 to 9 wt % $P_2O_5$.

In one embodiment containing $V_2O_5$, the starting mixture used to make the Pb—Te—Li—Ti—O is comprised of (based on the total weight of the Pb—Te—Li—Ti—O) at least 15 wt % but less than 25 wt % PbO, 45 to 65 wt % $TeO_2$, 0.1 to 4 wt % $Li_2O$, 0.25 to 5 wt % $TiO_2$ and 10 to 30 wt % $V_2O_5$. In another such embodiment, the Pb—Te—Li—Ti—O is comprised of at least 20 wt % but less than 25 wt % PbO, 45 to 60 wt % $TeO_2$, 0.5 to 2.5 wt % $Li_2O$, 0.5 to 3 wt % $TiO_2$ and 15 to 25 wt % $V_2O_5$.

The starting mixture used to make the Pb—Te—Li—Ti—O may include one or more of $SiO_2$, $SnO_2$, $B_2O_3$, and $Ag_2O$.

In one embodiment, the Pb—Te—Li—Ti—O may be a homogenous powder. In another embodiment, the Pb—Te—Li—Ti—O may be a combination of more than one powder, wherein each powder may separately be a homogenous population. The composition of the overall combination of the two powders is within the ranges described above. For example, the Pb—Te—Li—Ti—O may include a combination of two or more different powders. Separately, these powders may have different compositions, and may or may not be within the ranges described above; however, the combination of these powders is within the ranges described above, In an embodiment, the Pb—Te—Li—Ti—O composition may include one powder which includes a homogenous powder including some but not all of the elements of the group Pb, Te, Li, Ti, and O, and a second powder, which includes one or more of the elements of the group Pb, Te, Li, Ti, and O. For example, the Pb—Te—Li—Ti—O composition may include a first powder including Pb, Te, Li, and O, and a second powder including $TiO_2$. In an aspect of this embodiment, the powders may be melted together to form a uniform composition. In a further aspect of this embodiment, the powders may be added separately to the conductive silver paste composition.

In an embodiment, some or all of the $Li_2O$ may be replaced with $Na_2O$, $K_2O$, $Cs_2O$, or $Rb_2O$, resulting in a glass composition with properties similar to the compositions listed above. In this embodiment, the total alkali metal oxide content may be 0.1 to 4 wt % or 0.5 to 2.5 wt %.

In a further embodiment, the glass frit compositions herein may include one or more of a third set of components: $GeO_2$, $Ga_2O_3$, $In_2O_3$, NiO, ZnO, CaO, MgO, SrO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, FeO, $HfO_2$, $Cr_2O_3$, CdO, $Sb_2O_3$, $PbF_2$, $ZrO_2$, $Mn_2O_3$, CuO, $CeO_2$, $Nb_2O_5$, $Al_2O_3$, $Rb_2O$, $Na_2O$, $K_2O$, $Cs_2O$, $Lu_2O_3$, and metal halides (e.g., NaCl, KBr, NaI, LiF, $ZnF_2$).

Therefore as used herein, the term "Pb—Te—Li—Ti—O" may also include metal oxides such as oxides of P or V or both and one or more elements selected from the group consisting of Si, Sn, B, Ag, Na, K, Rb, Cs, Ge, Ga, In, Ni, Zn, Ca, Mg, Sr, Ba, Se, Mo, W, Y, As, La, Nd, Bi, Ta, V, Fe, Hf, Cr, Cd, Sb, F, Zr, Mn, P, Cu, Ce, Nb and Al.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species may be released during the process of making the glass. An example of a volatile species is oxygen.

If starting with a fired glass, one of ordinary skill in the art may calculate the percentages of starting components described herein using methods known to one of skill in the art including, but not limited to: Inductively Coupled Plasma-Mass Spectroscopy (ICP-MS), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm.

The presence of the impurities would not alter the properties of the glass, the thick-film composition, or the fired device. For example, a solar cell containing the thick-film composition may have the efficiency described herein, even if the thick-film composition includes impurities.

The Pb—Te—Li—Ti—O is present in the conductive silver paste in a proportion of 0.2 to 2.0 wt %, based on the total weight of the conductive silver paste. In one embodiment, the Pb—Te—Li—Ti—O is present in the conductive silver paste in a proportion of 0.5 to 1.25 wt %, based on the total weight of the conductive silver paste.

The lead-tellurium-lithium-titanium-oxide (Pb—Te—Li—Ti—O) glass compositions were prepared by mixing and blending $Pb_3O_4$, $TeO_2$, $Li_2CO_3$, and $TiO_2$ powders, and either $P_2O_5$ or $V_2O_5$. The blended powder batch materials were loaded into a platinum alloy crucible and then inserted into a furnace at 900-1000° C. using an air or $O_2$-containing atmosphere. The duration of the heat treatment was 20 minutes following the attainment of a full solution of the constituents. The resulting low viscosity liquid resulting from the fusion of the constituents was then quenched by metal roller, The quenched glass was then milled, and screened to provide a powder with a $d_{50}$ of 0.1 to 3.0 microns.

Organic Vehicle

The conductive silver paste comprises an organic vehicle, The organic vehicle is an organic solvent or an organic solvent mixture or, in another embodiment, the organic vehicle is a solution of organic polymer in organic solvent.

A wide variety of inert viscous materials can be used as an organic vehicle. The organic vehicle is one in which the other constituents, i.e., the particulate conductive silver and the Pb—Te—Li—Ti—O are dispersible with an adequate degree of stability, The properties, in particular, the rheological properties, of the organic vehicle must be that they lend good application properties to the conductive silver paste composition, including: stable dispersion of insoluble solids, appropriate viscosity and thixotropy for application, appropriate wettability of the paste solids, a good drying rate, and good firing properties.

The organic vehicle is typically a solution of one or more polymers in one or more solvents, The most frequently used polymer for this purpose is ethyl cellulose. Other examples of polymers are ethylhydroxyethyl cellulose, wood rosin, mixtures of ethyl cellulose and phenolic resins, polymethacrylates of lower alcohols, and rnonobutyl ether of ethylene glycol monoacetate. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The organic vehicle content in the conductive silver paste is dependent on the method of applying the paste and the kind of organic vehicle used. In one embodiment, it is from 5 to 20 wt %, based on the total weight of the conductive silver paste composition. In another embodiment, it is from 9 to 15 wt. %, based on the total weight of the conductive silver paste composition. These wt % include the organic solvent, any organic polymer and any other organic additives.

The conductive silver paste may comprise one or more other organic additives, for example, surfactants, thickeners, rheology modifiers and stabilizers. An organic additive may be part of the organic vehicle. However, it is also possible to add an organic additive separately when preparing the conductive silver paste.

Conductive Silver Paste

The application viscosity of the conductive silver paste is in the range of 150 to 300 Pa·s when it is measured at a spindle speed of 10 rpm and 25° C. by a utility cup using a Brookfield HBT viscometer and #14 spindle.

The conductive silver paste is applied to the holes of the silicon wafer to provide metallization and a conducting via from the front-side to the back-side of the metal-wrap-through solar cell, or from the backside to the front side. The conductive silver paste is applied in a way to completely fill the hole with conductive silver or in the form of a layer to cover at least the inside of the holes with a metallization, i.e. to form the metallization of at least the inside of the holes.

The method of conductive silver paste application may be printing, for example, screen printing. The application may be performed from the front-side and/or from the back-side of the solar cell.

After application, the conductive silver paste is dried, for example, for a period of 1 to 10 minutes with the silicon wafer reaching a peak temperature in the range of 100° C. to 300° C. Drying can be carried out making use of, for example, belt, rotary or stationary driers and in particular, IR (infrared) belt driers.

The dried conductive silver paste is fired to form the finished metallization of the holes. These metallization serve as emitter contacts and back-side contacts of the MWT silicon solar cell. The firing is performed for a period of 1 to 5 minutes with the silicon wafer reaching a peak temperature in the range of 550° C. to 900° C. The firing can be carried out making use of single or multi-zone belt furnaces, in particular, multi-zone IR belt furnaces. The firing can take place in an inert gas atmosphere or in the presence of oxygen, e.g., in the presence of air. During firing the organic substance including non-volatile organic material and the organic portion not evaporated during the drying is removed. The organic substance removed during firing includes organic solvent, organic polymer and any organic additives present.

The conductive silver paste firing process can be a co-firing process in which front-side metallization in the form of thin conductive metal collector lines arranged in a pattern typical for MWT silicon solar cells and applied from a conductive metal paste and/or silver backside collector contacts applied from a back-side silver paste are fired at the same time.

The conductive silver paste can be applied to MWT silicon solar cells that have emitters within the vias as well as to MWT silicon solar cells that do not have emitters within the vies. The conductive silver paste can also be applied to MWT silicon solar cells that have antireflective coating within the vies as well as to MWT silicon solar cells that do not have antireflective coating within the vias. The conductive silver paste can be applied to MWT silicon solar cells with an n-type or a p-type silicon base.

Also provided is a metal-wrap-through silicon solar cell comprising the fired conductive silver paste of the invention.

EXAMPLES

Example 1

This Example was carried out to prepare a Pb—Te—Li—Ti—O glass composition containing $P_2O_5$. It was prepared by mixing and blending $Pb_3O_4$, $TeO_2$, $Li_2CO_3$, $TiO_2$ and $P_2O_5$ powders in proportions to prepare a $P_2O_5$-containing Pb—Te—Li—Ti—O glass composition with 23.23 wt % PbO, 67.59 wt % $TeO_2$, 1.05 wt % $Li_2O$, 2.08 wt % $TiO_2$ and 6.06 wt % $P_2O_5$. The blended powder batch materials were loaded to a platinum alloy crucible then inserted into a furnace and heated at 900° C. in air or $O_2$ for one hour to melt the mixture. The liquid melt was quenched from 900° C. by removing the platinum crucible from the furnace and pouring the melt through counter rotating a stainless steel rollers gapped to 0.010-0.020". The resulting material was coarsely crushed in a stainless steel container. The crushed material was then ball-milled in an alumina-silicate ceramic ball mill with zirconia media and water until the $d_{50}$ was 0.5-0.7 microns. The ball-milled material was then separated from the milling balls, wet screened and dried by hot air oven.

Example 2

This Example was carried out to prepare a Pb—Te—Li—Ti—O glass composition containing $V_2O_5$. It was prepared by mixing and blending $Pb_3O_4$, $TeO_2$, $Li_2CO_3$, $TiO_2$ and $V_2O_5$ powders in proportions to prepare a $V_2O_5$-containing Pb—Te—Li—Ti—O glass composition with 23.92 wt % PbO, 52.45 wt % $TeO_2$, 1.14 wt % $Li_2O$, 2.24 wt % $TiO_2$ and 20.25 wt % $V_2O_5$. The blended powder batch materials were loaded to a platinum alloy crucible then inserted into a furnace and heated at 900° C. in air or $O_2$ for one hour to melt the mixture. The liquid melt was quenched from 900° C. by removing the platinum crucible from the furnace and pouring the melt through counter rotating a stainless steel rollers gapped to 0.010-0.020". The resulting material was coarsely crushed in a stainless steel container. The crushed material was then ball-milled in an alumina-silicate ceramic ball mill with zirconia media and water until the $d_{50}$ was 0.5-0.7 microns. The ball-milled material was then separated from the milling balls, wet screened and dried by hot air oven.

Example 3

This Example could be carried out to prepare a conductive silver paste containing the $P_2O_5$-containing Pb—Te—Li—Ti—O glass composition of Example 1 using the following components in the parts by weight, i.e., wt % based on the total weight of the paste, indicated:

10.5 parts of organic vehicle of ethyl cellulose dissolved in solvent, wherein the ethyl cellulose is about 10 wt % of the total weight of the solution;
 0.50 part of thixotrol for paste rheology (can be obtained from Rheox, Inc., Hightstown, N.J.);
 1.00 part surfactant—Duomeen® TDO (can be obtained from AKZO Nobel Chemicals, Inc., Chicago, Ill.);
 0.75 part Pb—Te—Li—Ti—O composition of Example 1;
 87.25 parts of Ag powder of spherical silver particles with a $d_{50}$ of 1.8 µm, a $d_{10}$=1.1 µm and a $d_{90}$=3.5 µm.

All the components except the Pb—Te—Li—Ti—O and the silver powder are mixed in a mixing can for minutes. The Pb—Te—Li—Ti—O and the silver powder are then added and mixing is continued for another 15 minutes. Since the Ag powder is the major portion of the solids, it is added incrementally to insure better wetting. When mixing is completed, the resulting paste is repeatedly passed through a 3-roll mill with progressively increased pressures from 0 to 400 psi. The gap of the mill is adjusted to 1 mil (25.4 µm). The degree of dispersion is measured by fineness of grind (FOG) to insure that the FOG is less than or equal to 20/10.

The paste is then used to fill solar cell vias and then fired.

Example 4

This Example could be carried out to prepare a conductive silver paste containing the $V_2O_5$-containing Pb—Te—Li—Ti—O glass composition of Example 2 using the following components in the parts by weight, i.e., wt % based on the total weight of the paste, indicated:
- 10.5 parts of organic vehicle of ethyl cellulose dissolved in solvent, wherein the ethyl cellulose is about 10 wt % of the total weight of the solution;
- 0.50 part of thixotrol for paste rheology (can be obtained from Rheox, Inc., Hightstown, N.J.);
- 1.00 part surfactant—Duomeen® TDO (can be obtained from AKZO Nobel Chemicals, Inc., Chicago, Ill.);
- 0.75 part Pb—Te—Li—Ti—O composition of Example 2;
- 87.25 parts of Ag powder of spherical silver particles with a $d_{50}$ of 1.8 µm, a $d_{10}$=1.1 µm and a $d_{90}$=3.5 µm.

All the components except the Pb—Te—Li—Ti—O and the silver powder are mixed in a mixing can for minutes. The Pb—Te—Li—Ti—O and the silver powder are then added and mixing is continued for another 15 minutes. Since the Ag powder is the major portion of the solids, it is added incrementally to insure better wetting. When mixing is completed, the resulting paste is repeatedly passed through a 3-roll mill with progressively increased pressures from 0 to 400 psi. The gap of the mill is adjusted to 1 mil (25.4 µm). The degree of dispersion is measured by fineness of grind (FOG) to insure that the FOG is less than or equal to 20/10.

The paste is then used to fill solar cell vias and then fired.

What is claimed is:

1. A conductive silver paste comprising:
   (a) silver,
   (b) a glass composition consisting of at least 15 wt % but less than 25 wt % PbO, 50 to 75 wt % $TeO_2$, 0.1 to 4 wt % $Li_2O$, 0.25 to 5 wt % $TiO_2$, and 3 to 12 wt % $P_2O_5$; and
   (c) an organic vehicle, wherein said silver and said glass composition are dispersed in said organic vehicle.

2. The conductive silver paste of claim 1, wherein said glass composition consists of at least 20 wt % but less than 25 wt % PbO, 55 to 75 wt % $TeO_2$, 0.5 to 2.5 wt % $Li_2O$, 0.5 to 3 wt % $TiO_2$ and 3 to 9 wt % $P_2O_5$.

3. A glass composition consisting of at least 15 wt % but less than 25 wt % PbO, 45 to 65 wt % $TeO_2$, 0.1 to 4 wt % $TiO_2$, 0.25 to 5 wt % $TiO_2$ and 10 to 30 wt % $V_2O_5$.

4. The glass composition of claim 3, said glass composition consisting of at least 20 wt % but less than 25 wt % PbO, 45 to 60 wt % $TeO_2$, 0.5 to 2.5 wt % $Li_2O$, 0.5 to 3 wt % $TiO_2$ and 15 to 25 wt % $V_2O_5$.

5. A conductive silver paste comprising:
   (a) silver;
   (b) a glass composition of claim 3 or 4; and
   (c) an organic vehicle, wherein said silver and said glass composition are dispersed in said organic vehicle.

6. The conductive silver paste of claim 5, wherein said silver is in the form of silver particles.

7. The conductive silver paste of claim 6, wherein said silver particles are spherical.

8. The conductive silver paste of claim 7, wherein said spherical silver particles have a surface coating of surfactant.

9. The conductive silver paste of claim 8, wherein said surface coating of surfactant is a diethylene glycol coating.

10. The conductive silver paste of claim 7, said spherical silver particles having a $d_{50}$ of from 1.7 to 1.9 µm and a $d_{10}$≥1 µm and a $d_{90}$≤3.8 µm.

11. The conductive silver paste of claim 5, wherein said silver is in the form of irregular particles having a $d_{50}$ of from 5.4 to 11.0 µm.

12. The conductive silver paste of claim 6, wherein said silver particles are in flake form.

13. The conductive silver paste of claim 5, said conductive silver paste comprising 80-90 wt % silver and 0.2 to 2.0 wt % glass composition, based on the total weight of the conductive silver paste.

14. The conductive silver paste of claim 13, said conductive silver paste comprising 85-90 wt % silver.

15. A metal-wrap-through silicon solar cell with an n-type or a p-type silicon base comprising the fired conductive silver paste of claim 5.

* * * * *

UNITED STATES PATENT AND TRADEMARK OFFICE
CERTIFICATE OF CORRECTION

PATENT NO. : 9,087,937 B2
APPLICATION NO. : 13/685893
DATED : July 21, 2015
INVENTOR(S) : Kenneth Warren Hang and Yueli Wang Page 1 of 1

It is certified that error appears in the above-identified patent and that said Letters Patent is hereby corrected as shown below:

In the claims,

Column 10, Claim 1, Line 5, change "aredispersed" to read -- are dispersed --.

Column 10, Claim 3, Lines 2 and 3, change "0.1 to 4 wt% $TiO_2$" to read -- 0.1 to 4 wt% $Li_2O$ --.

Signed and Sealed this
Tenth Day of November, 2015

Michelle K. Lee
*Director of the United States Patent and Trademark Office*